United States Patent
Aoyagi et al.

(10) Patent No.: US 6,573,170 B2
(45) Date of Patent: Jun. 3, 2003

(54) PROCESS FOR MULTILAYER WIRING CONNECTIONS AND BONDING PAD ADHESION TO DIELECTRIC IN A SEMICONDUCTOR INTEGRATED CIRCUIT DEVICE

(75) Inventors: Takashi Aoyagi, Hitachinaka (JP); Atsushi Ogishima, Tachikawa (JP); Hirotaka Kobayashi, Kodaira (JP); Yuji Hara, Akishima (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 09/748,163

(22) Filed: Dec. 27, 2000

(65) Prior Publication Data

US 2001/0005624 A1 Jun. 28, 2001

(30) Foreign Application Priority Data

Dec. 27, 1999 (JP) .......................... 11-370790

(51) Int. Cl.[7] .............................................. H01L 21/00
(52) U.S. Cl. ...................................... 438/612; 438/625
(58) Field of Search ................................ 438/625, 637, 438/653, 612, 617

(56) References Cited

U.S. PATENT DOCUMENTS

| | | | | |
|---|---|---|---|---|
| 5,904,556 | A | * | 5/1999 | Suzuki et al. ................ 438/623 |
| 6,028,360 | A | * | 2/2000 | Nakamura et al. .......... 257/306 |
| 6,215,144 | B1 | * | 4/2001 | Saito et al. .................. 257/303 |
| 6,235,572 | B1 | * | 5/2001 | Kunitomo et al. .......... 438/240 |
| 6,235,620 | B1 | * | 5/2001 | Saito et al. .................. 438/586 |
| 6,239,681 | B1 | * | 5/2001 | Buswell ..................... 29/602.1 |
| 6,258,649 | B1 | * | 7/2001 | Nakamura et al. .......... 438/238 |
| 6,291,331 | B1 | * | 9/2001 | Wang et al. ................. 438/618 |
| 2002/0020918 | A1 | * | 2/2002 | Anand ......................... 257/758 |

FOREIGN PATENT DOCUMENTS

| | | | | |
|---|---|---|---|---|
| JP | 10-247664 | * | 9/1998 | ........... H01L/21/60 |
| JP | 2000-200878 | * | 7/2000 | ........... H01L/27/08 |

* cited by examiner

*Primary Examiner*—William David Coleman
(74) *Attorney, Agent, or Firm*—Antonelli, Terry, Stout & Kraus, LLP

(57) ABSTRACT

A semiconductor integrated circuit device including a plurality of holes in an interlayer insulating film beneath a bonding pad wherein a plug is buried in the respective holes and is made of the same conductive film (W/TiN/Ti) as a plug in a through-hole. Any wire as a second layer is not formed in a lower region of the bonding pad. The plug buried in the holes is connected only to the upper boding pad and is not connected to a lower wire.

12 Claims, 19 Drawing Sheets

PROCESS FOR MULTILAYER WIRING CONNECTIONS AND BONDING PAD ADHESION TO DIELECTRIC IN A SEMICONDUCTOR INTEGRATED CIRCUIT DEVICE

BACKGROUND OF THE INVENTION

This invention relates to a semiconductor integrated circuit device and also to a technique of manufacturing the same. More particularly, the invention relates to a technique effective for improving the property of adhesion between a bonding pad and an interlayer insulating film provided therebelow.

In order to prevent the separation of a bonding pad that will occur in the course of the step of sealing, with a tape carrier package (TCP), a semiconductor chip including an interlayer insulating film having a three-layered structure wherein a spin-on-glass (SOG) film is sandwiched between two silicon oxide films, Japanese Laid-open Patent Application No. Hei 10(1998)-247664 discloses a technique wherein a dummy wiring is provided below the bonding pad formed on the interlayer insulating film so as to increase an area of mutual contact of the two silicon oxide films at the lower region of the bonding pad, thereby suppressing the interfacial separation between the SOG film and the silicon oxide films.

SUMMARY OF THE INVENTION

In recent years, as a chip size is more reduced owing to a higher degree of integration of LSI, the bonding pad is also reduced in size.

We have found that there is being actualized a phenomenon wherein a stress exerted per unit area of a bonding pad increases at the time of wire bonding, and an uppermost Al (aluminum) wire constituting a bonding pad and a lower interlayer insulating film are separated from each other at the interface thereof. Especially, in the course of manufacture of MCP (multi chip package), there is used a KGD (known good die) technique in order to guarantee the quality of individual chips prior to assembling. In this case, a wire is bonded on the respective bonding pads upon inspection at the stage of individual chips and also at the package stage, under which we have found that the bonding pad is more liable to separate.

As a measure for preventing the separation of the bonding pad, it may occur that the bonding pad is constituted, for example, of a two-layered structure including an uppermost Al wire and a lower Al wire so as to increase strength thereof. In this case, however, the structure is so designed as to include an interlayer insulating film, which is made of silicon oxide whose hardness is higher than Al, interposed between the two Al wires. This will permit the hard layer insulating layer to be cracked when wire bonded, thereby causing the separation of the bonding pad.

An object of the invention is to provide a technique of suppressing the separation of a bonding pad.

The above and other objects, and novel features of the invention will become apparent from the description of the specification and accompanying drawings.

Typical embodiments of the invention are summarized below.

(1) The semiconductor integrated circuit device according to the invention comprises a plurality of wiring layers formed on a semiconductor substrate through an interlayer insulating film, a first interlayer insulating film provided beneath a bonding pad formed on an upper wiring layer, and a first plug formed in the first interlayer insulating film in such a way that a first conductive film is buried in a hole formed in the first interlayer insulating film wherein any wire connected to the first plug is not formed in a wiring layer beneath the first plug.

(2) The semiconductor integrated circuit device of the invention comprises a plurality of wiring layers formed on a semiconductor substrate through an interlayer insulating film, a bonding pad formed on an upper wiring layer and connected to a wire, a first interlayer insulating film provided at a lower region of the wire, and a first plug formed in the first interlayer insulating film in such a way that a first conductive film is buried in a hole formed in the first interlayer insulating film wherein any wire is not formed in a wiring layer below the first plug.

(3) The semiconductor integrated circuit device of the invention comprises a plurality of wiring layers formed on a semiconductor substrate through an interlayer insulating film, a bonding pad formed at an uppermost wiring layer, a first interlayer insulating film provided beneath the bonding pad, a first plug formed in the first interlayer insulating film in such a way that a first conductive film is buried in a hole formed in the first interlayer insulating film, and a wire formed in a wiring layer beneath the first plug and made of a third conductive film whose hardness is higher than that of a second conductive film constituting the uppermost wire.

(4) The method for manufacturing a semiconductor integrated circuit device according to the invention comprises the steps of:
(a) forming a wire in an element-forming region on a semiconductor substrate and further forming a first interlayer insulating film over the wire;
(b) etching the first interlayer insulating film in the element-forming region to form a first through-hole reaching the wire, and etching the first interlayer insulating film in a bonding pad-forming region to form a hole;
(c) forming a barrier metal film on the first interlayer insulating film comprising the inner surfaces of the hole and the inner surfaces of the first through-hole and forming a first conductive film containing as its main component a refractory metal on the upper portion of the barrier metal film so that the first conductive film is buried in the hole and the first through-hole;
(d) removing the first conductive film from the upper portion of the first interlayer insulating film by etching to form a first plug constituted of the barrier metal film and the first conductive film in the hole and also a second plug constituted of the barrier metal film and the first conductive film in the first through-hole;
(e) forming a second conductive film over the upper portion of said first interlayer insulating film; and
(f) etching the second conductive film so that an uppermost wire is formed on the first interlayer insulating film in the element-forming region and forming a bonding pad on the first interlayer insulating film in the bonding pad-forming region.

DESCRIPTION OF THE PREFERRED EMBODIMENTS

Figure 1:
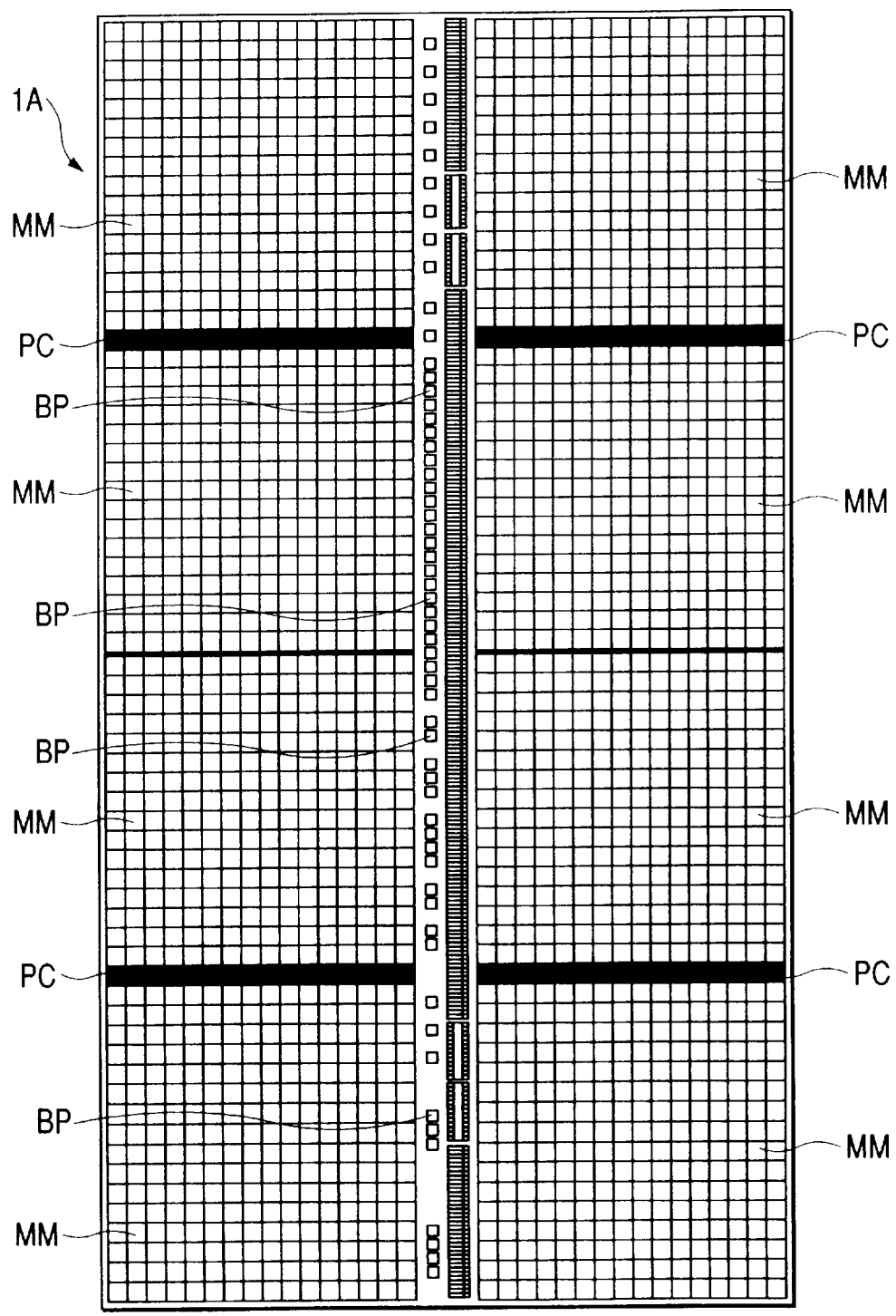
FIG. 1 is a plan view showing a semiconductor chip, as a whole, formed on a semiconductor integrated circuit device according to one embodiment of the invention.

The embodiments of the invention are described in detail with reference to the accompanying drawings. It will be noted that in all the figures illustrating the embodiments of the invention, like reference numerals indicate like parts or members and may not be repeatedly explained after once illustrated.

FIG. 1 is a plan view showing, as a whole, semiconductor chip 1A forming DRAM (dynamic random access memory) according to one embodiment of the invention.

A DRAM having a memory capacity, for example, of 256 M bit is formed on the main surface of the rectangular semiconductor chip 1A. This DRAM has a memory portion divided into a plurality of memory mats MM and peripheral circuit portions PC arranged therearound. At the center of the semiconductor chip 1A, a plurality of bonding pads BP are arranged in line, to which wires, bump electrodes and the like are connected.

Figure 2:
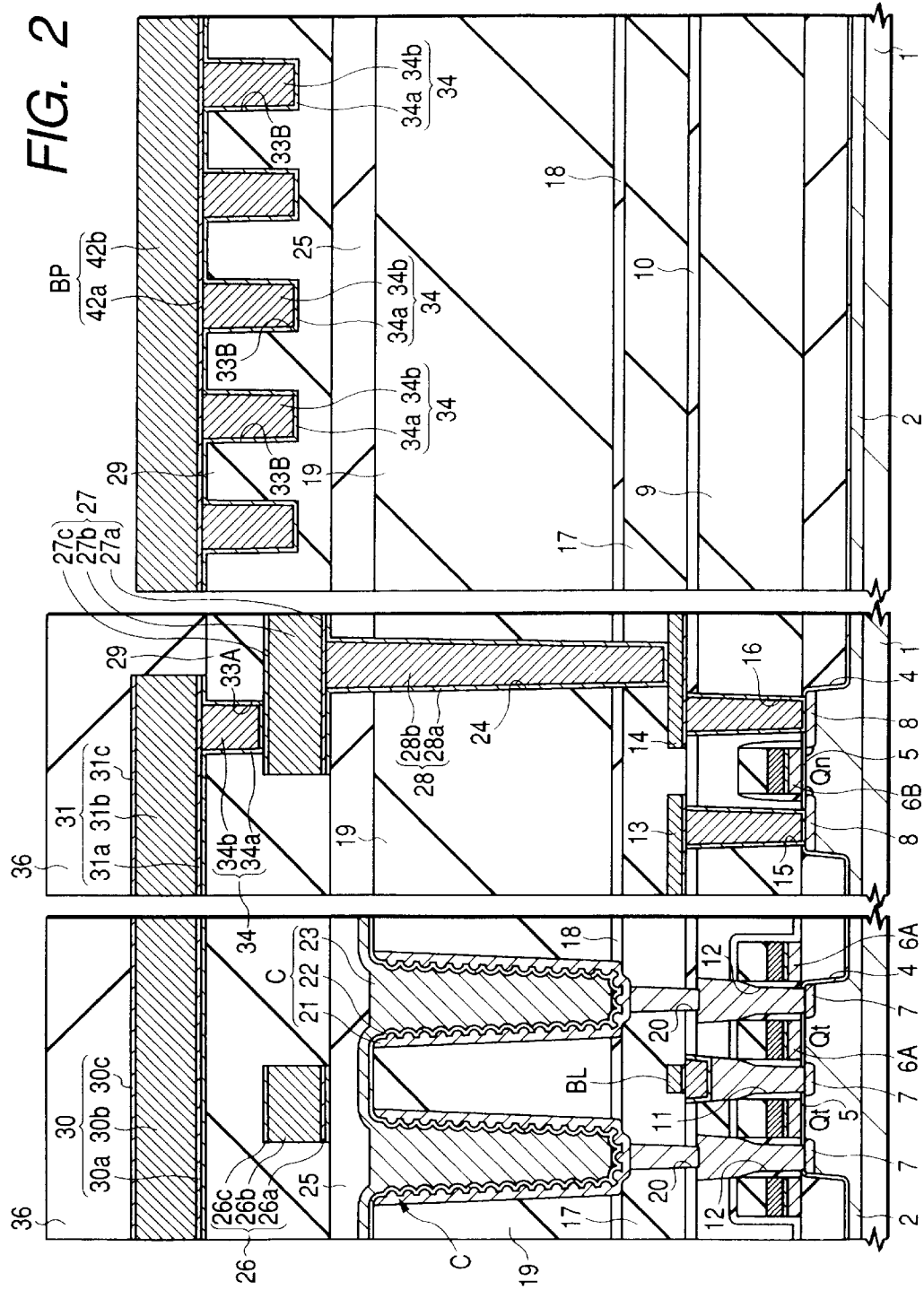
FIG. 2 is a sectional view of an essential part of a semiconductor substrate forming the semiconductor integrated circuit device according to the one embodiment of the invention.

FIG. 2 is a sectional view showing an essential part of a semiconductor substrate (hereinafter referred to simply as substrate) on which the DRAM is formed. The left side portion of this figure indicates part of the memory portion (memory mat MM), the central portion indicates part of the peripheral circuit portion PC, and the right side portion indicates part of a region (i.e. the central portion of the semiconductor chip 1A) at which the bonding pads BP are formed, respectively.

For instance, a p-type well 2 is formed on the main surface of a substrate 1 made of p-type single crystal silicon, an element-isolating groove 4 is formed in an element-isolating region of the p-type well. The element-isolating groove 4 has such a structure that a groove formed by etching the substrate 1 is buried with an insulating film such as of silicon oxide.

A plurality of memory cells are formed in an active region of the p-type well 2 of the memory portion. The respective memory cells are constituted of one MISFET (metal insulator semiconductor field effect transistor) Qt for memory cell selection constituted of an n-channel MISFET, and one information storage capacitor element C connected in series with the MISFET Qt for memory cell selection.

The MISFET Qt for memory cell selection is constituted mainly of a gate oxide film 5, a gate electrode 6A integrally constituted with a word line, and n-type semiconductor regions (source, drain) 7. The gate electrode 6A (word line) is made of a three-layered conductive film, for example, of a low resistance polysilicon film doped with P (phosphorus), a WN (tungsten nitride) film and a W (tungsten) film.

In the active region of the p-type well 2 of the peripheral circuit portion, an n-channel MISFET Qn is formed. The n-channel MISFET Qn is constituted, mainly, of the gate oxide 5, a gate electrode 6B made of such a three-layered conductive film as the gate electrode 6A (word line), and n-type semiconductor regions 8 (source, drain) having an LDD (lightly doped drain) structure. An n-type well is formed in the substrate 1 of a region of the peripheral circuit portion not shown in the figure. A p-channel MISFET is formed at the n-type well. More particularly, a circuit in the peripheral circuit portion is constituted with a complementary MISFET made of the n-channel MISFET Qn and the p-channel MISFET in combination.

Silicon oxide films 9, 10 are, respectively, formed on the MISFET Qt for memory cell selection and the n-channel MISFET Qn, and a bit line BL, with which data of a memory cell is read out, is formed on the upper portion of the silicon oxide film 10 of the memory portion. The bit line BL is constituted of a conductive film wherein a W film is formed on a barrier metal film made, for example, of a multi-layered film including a Ti (titanium) film and a TiN (titanium nitride) film. The bit line BL is electrically connected with one of the n-type semiconductor regions (source, drain) of the MISFET Qt for memory cell selection via a contact hole 11 that is made of a low resistance polysilicon film doped, for example, with P (phosphorus) and buried with a plug.

Wires 13, 14 of a first layer are formed over the silicon oxide film 10 of the peripheral circuit portion. The wires 13, 14 are, respectively, constituted of a multi-layered film of a barrier metal film and a W film, like the bit line BL. These wires 13, 14 are electrically connected with the n-type semiconductor regions (source, drain) of the n-channel MISFET Qn via contact holes 15, 16 made of a multi-layered film, for example, of a barrier metal (TiN/Ti) film and a W film and buried with a plug, respectively.

A silicon oxide film 17 is formed over the bit line BL and the wires 13, 14, respectively, and an information storage capacitor element C is formed over a silicon oxide film 17 of the memory portion. The information storage capacitor element C is formed in a deep groove formed by etching a silicon nitride film 18 on the silicon oxide film 17 and a thick silicon oxide film 19 formed thereon, and is constituted of a lower electrode (storage electrode) 21, a capacitive insulating film 22 on the lower electrode 21, and an upper electrode (plate electrode) 23 formed on the capacitive insulating film 22.

The lower electrode 21 of the information storage capacitor element C is constituted of a low resistance polysilicon film doped, for example, with P (phosphorus), and is electrically connected to the other of the n-type semiconductor regions (source, drain) of MISFET Qt for memory cell selection via the through-hole 20, in which a plug made similarly of a low resistance polysilicon film, and the contact hole 12 provided therebelow. The capacitive insulating film over the lower electrode 21 is made, for example, of a $Ta_2O_5$ (tantalum oxide) film, and the plate electrode 23 is made, for example of a TiN film.

A silicon oxide film 25 is formed over the information storage capacitor element C. A second-layer wire 26 is formed on or over the silicon oxide film 25 of the memory portion, and a second-layer wire 27 is likewise formed on or over the silicon oxide film 25 of the peripheral circuit portion. The wire 26 of the memory portion is constituted of a conductive film containing Al (aluminum) as a main component, e.g. a three-layered conductive film consisting of a thick Al alloy film (26b) containing Cu (copper) and Si (silicon), and a thin Ti film (26a) and a thin TiN film (26c) sandwiching the Al alloy film (26b) therebetween. Similarly, the wire 27 of the peripheral circuit portion is constituted of a three-layered conductive film consisting of a thick Al alloy film (27b), and a thin Ti film (27a) and a thin TiN film (27c) sandwiching the Al alloy film (27b) therebetween. The wire 27 is electrically connected to the first wiring layer 13 via a through-hole 24 formed in the silicon oxide film 25 and the insulating films (silicon oxide film 19, silicon nitride film 18 and silicon oxide film 17) provided therebelow. A plug 28, which is made, for example, of a multi-layered film of a barrier metal (TiN/Ti) film (28a) and a W film (28b), is buried in the through-hole.

An interlayer insulating film (first interlayer insulating film) 29, which is made of a three-layered insulating multi-layered film consisting, for example, of a silicon oxide film, a spin-on-glass (spin coating) film and a silicon oxide film, is formed over the second-layer wires 26, 27. A third-layer wire 30 is formed over the interlayer insulating film 29 at the memory portion, and a third-layer wire 31 is likewise formed over the interlayer insulating film 29 at the peripheral circuit portion. Moreover, a bonding pad BP is formed over the interlayer insulating film 29 at the right side of FIG. 2 (i.e. a bonding pad-forming region).

The wire 30 at the memory portion is constituted of a three-layered conductive film consisting of a thick Al alloy film (30b), and a thin Ti film (30a) and a thin TiN film (30c) sandwiching the Al alloy film (30b) therebetween. Similarly, the wire 31 at the peripheral circuit portion is constituted of a three-layered conductive film consisting of a thick Al alloy film (31b), and a thin Ti film (31a) and a thin TiN film (31c) sandwiching the Al alloy film (31b) therebetween. This wire 31 is electrically connected to the second-layer wire 27 via a through-hole 33A formed in the interlayer insulating film 29. A plug (second plug) 34 made, for example, of a multi-layered film of a barrier metal (TiN/Ti) film 34a and a W film 34b is buried in the through-hole 33A.

The bonding pad BP is formed by use of the wire formed in the same step as the third-layer wires 30, 31, each made of the three-layered conductive film. In the step of forming the bonding pad BP, the uppermost TiN film is removed, so that the pad is actually constituted of a two-layered conductive film made of thin Ti film (42a) and a thick Al alloy film (42b) above the Ti film.

In the interlayer insulating film 29 beneath the bonding pad BP, a plurality of holes 33B are formed at certain intervals, and a plug (first plug) 34 is buried inside each of the holes 33B. This plug 34 is constituted, for example, of the multi-layered film of the barrier metal (TiN/Ti) film 34a and the W film 34b, like the plug 34 inside the through-hole 33A.

As shown, any second-layer wire is not formed in the region below the bonding pad BP. More particularly, the plug 34 buried in the hole 33B is connected only to the upper bonding pad BP and is not connected to the second-layer wire. In this way, the hole 33B, in which the plug 34 is buried, is formed below the bonding pad BP, and any wire connected to the plug 34 is not formed in the wiring layer (i.e. the second wiring layer) beneath the plug 34, so that, as described hereinafter, the adhesion between the bonding pad BP and the lower interlayer insulating film 29 can be improved.

Figure 3:
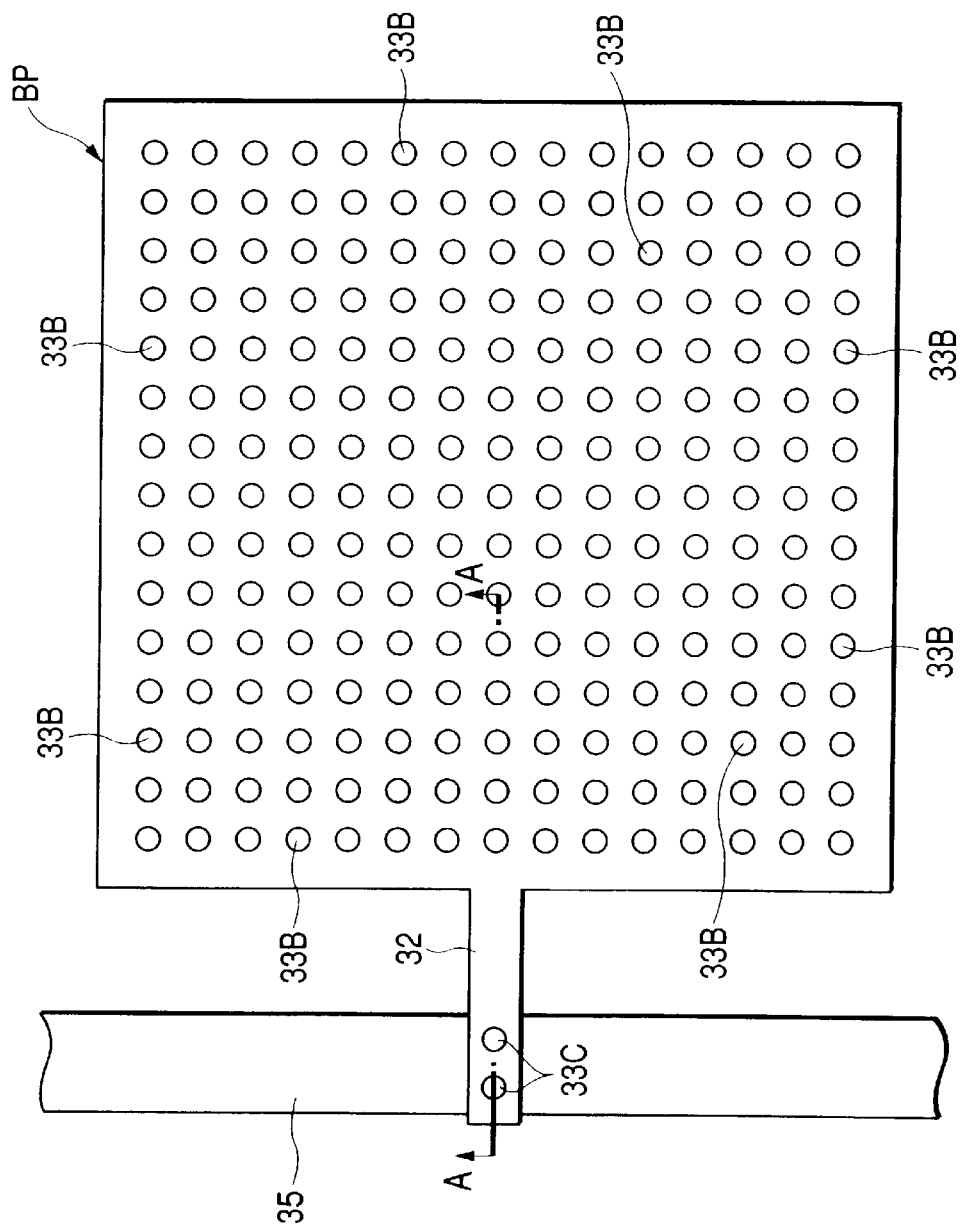
FIG. 3 is a plan view showing a layout of a bonding pad and a plug formed therebelow.
Figure 4:
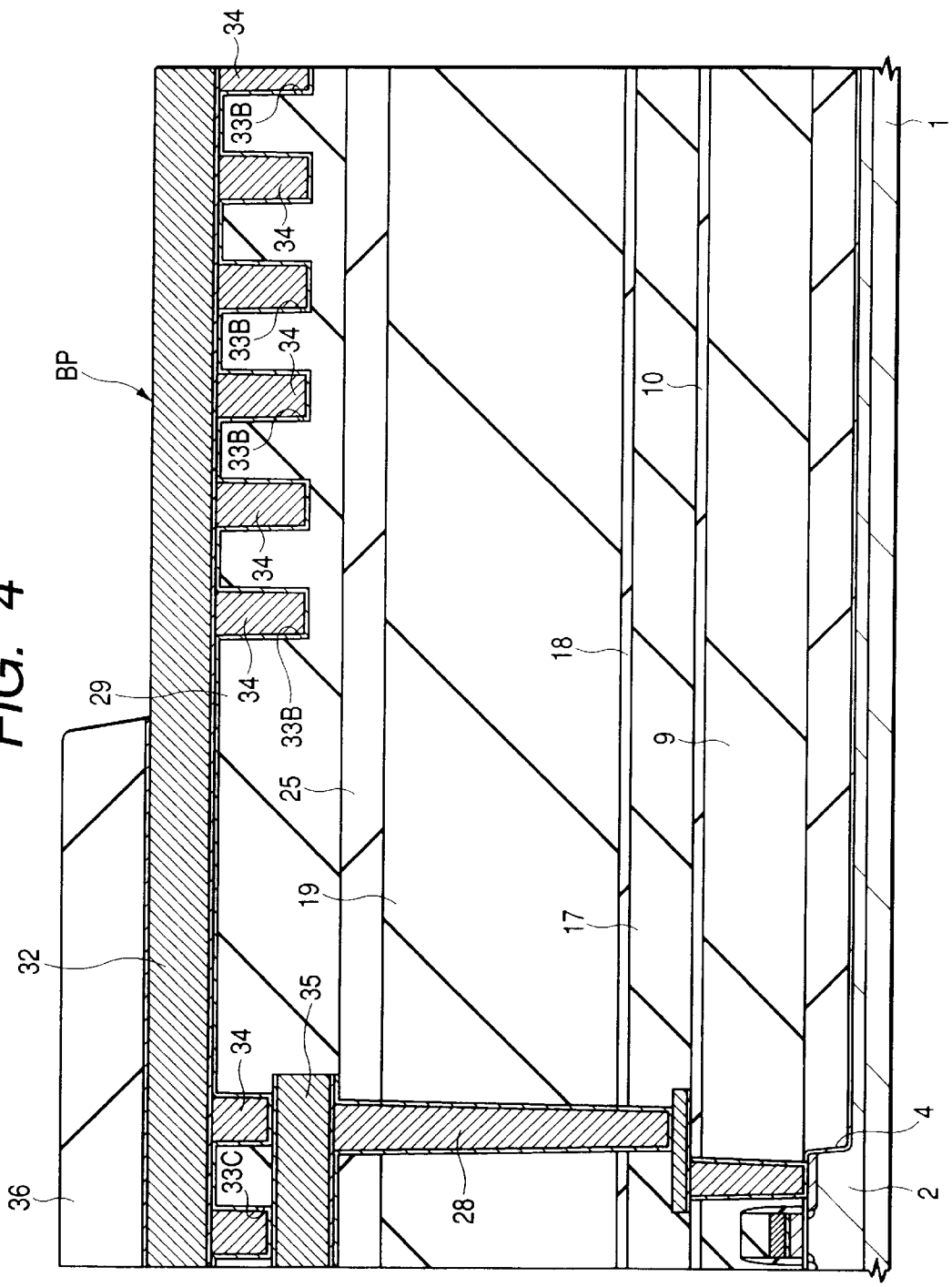
FIG. 4 is a sectional view of the essential part of the semiconductor substrate, taken along the line A—A of FIG. 3.

FIG. 3 is a plan view showing a layout of the bonding pad BP and the hole 33B (plugs 34), and FIG. 4 is a section view, taken along the line A—A of FIG. 3.

As shown in these figures, the bonding pad has a substantially square, flat shape, with its outer dimensions, for example, of 80 μm in length×80 μm in width. The bonding pad BP is connected at one side thereof with one end of a lead wire 32. The lead wire 32 is connected, at the other end, with a lower (second-layer) wire 35 via 33C formed in the interlayer insulating film 29. The through-hole 33C is buried therein with the plug 34 made of the same type of conductive film (i.e. a W film and a barrier metal film) as in the through-hole 33A formed in the element-forming region and also in the hole 33B formed below the bonding pad BP.

A plurality of the holes 33B formed below the bonding pad BP are arranged substantially at equal intervals entirely over the lower region of the bonding pad BP, with the spaces of adjacent holes 33B being, for example, at 0.6 μm. The diameter of the hole 33B is, for example, at 0.3 μm and is almost equal to the diameter of the through-hole 33A or 33C formed in the interlayer insulating film 29 in other regions. Where a wire is bonded to an upper portion of the bonding pad BP, the holes 33B may be formed only below the region where the wire is to be bonded (i.e. a region except the peripheral portion of the bonding pad BP), not over the entirety of the lower region of the bonding pad BP.

There is formed, on the third-layer wires 30, 31 or on the surface of the substrate 1, a passivation (surface protective film) film 36 constituted, for example, of a two-layered insulating film wherein a silicon oxide film and a silicon nitride film are formed.

Next, the process for manufacturing the DRAM having such an arrangement as set out hereinabove is described with reference to FIGS. 5 to 12.

Figure 5:
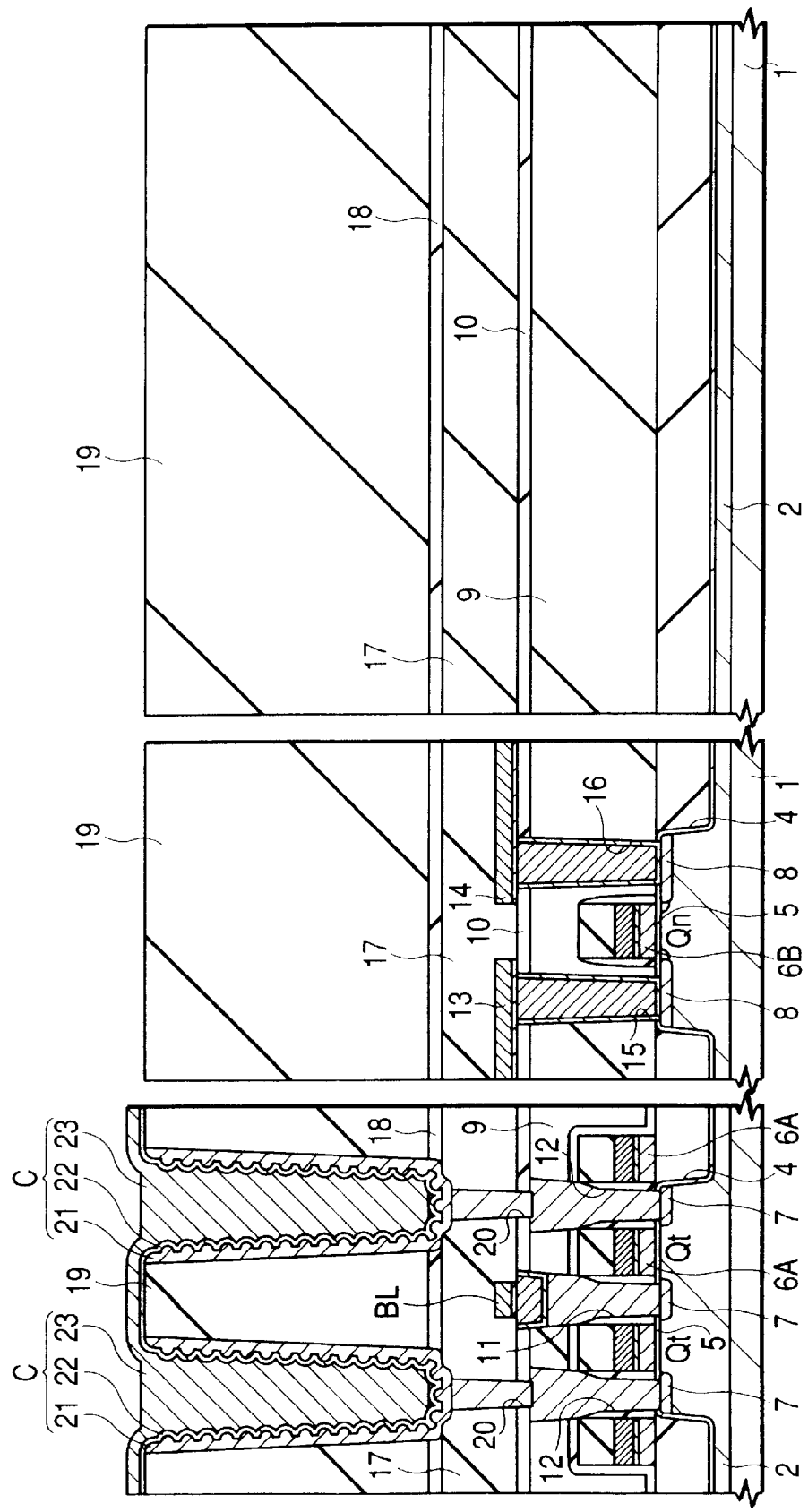
FIG. 5 is a sectional view of an essential part of a semiconductor substrate showing a step in a process for manufacturing a semiconductor integrated circuit device according to the one embodiment of the invention.

Initially, as shown in FIG. 5, MISFET Qt for memory cell selection is formed in the substrate 1 at the memory portion thereof and n-channel MISFET Qn is also formed in the substrate 1 at the peripheral circuit portion. Thereafter, a bit line BL is formed over the MISFET Qt for memory cell selection, and first-layer wires 13, 14 are formed over the n-channel MISFET Qn. Subsequently, an information storage capacitor element C is formed over the bit line BL to complete a memory cell. It will be noted that the method of forming a memory cell having such an arrangement as mentioned above is described in detail, for example, in Japanese Patent Application No. Hei 10(1998)-374881, U.S. patent application Ser. No. 09/473,297, filed Dec. 28, 1999.

Figure 6:
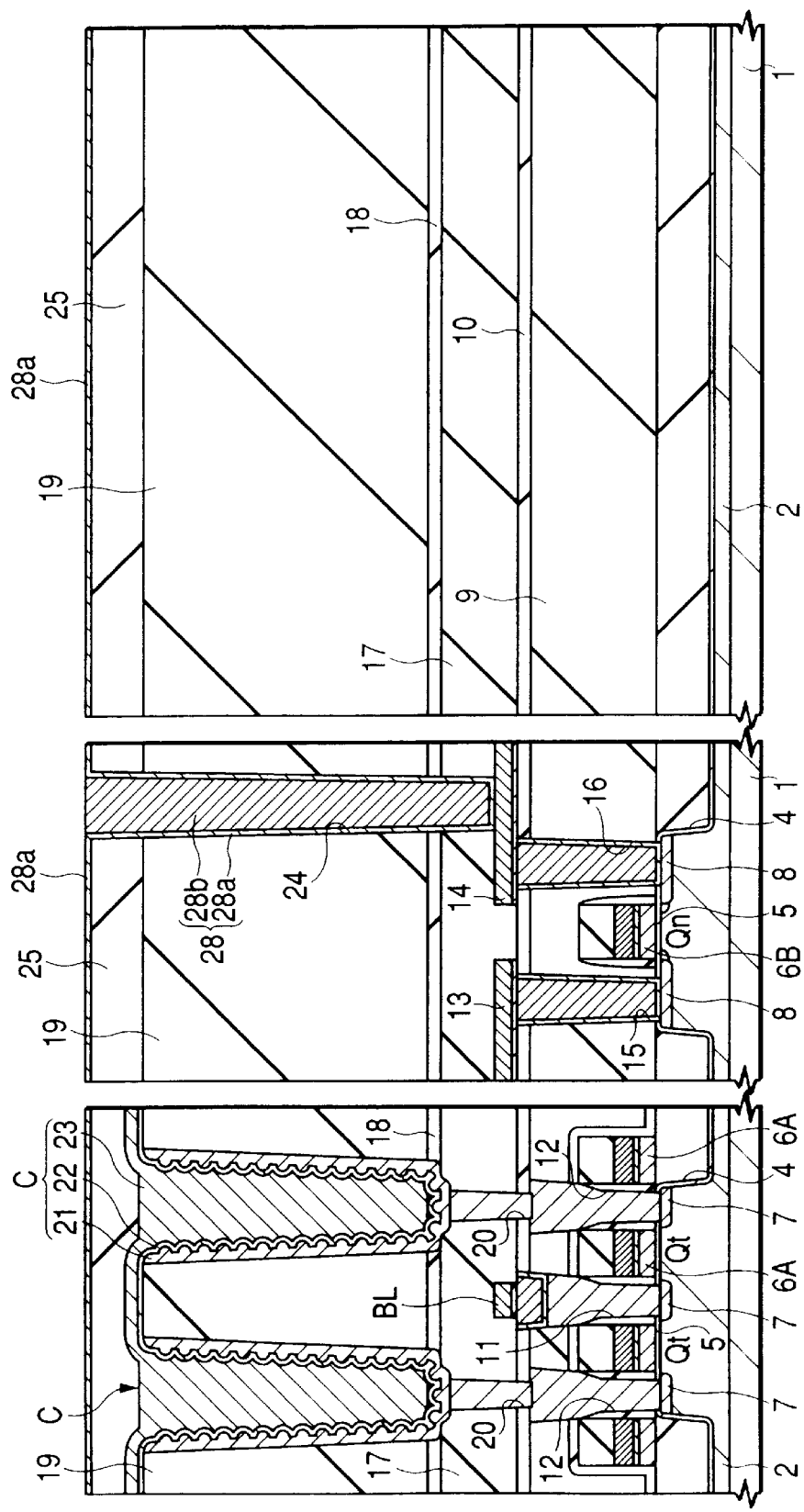
FIG. 6 is a sectional view of the essential part of the semiconductor substrate showing another step in the process for manufacturing the semiconductor integrated circuit device according to the one embodiment of the invention.

Thereafter, as shown in FIG. 6, a silicon oxide film 25 is formed over the information storage capacitor element C, followed by etching the silicon oxide film 25 at the peripheral circuit portion and lower insulating films (including a silicon oxide film 19, silicon nitride film 18 and silicon oxide film 17) to form a through-hole 24 and forming a plug 28 in the through-hole 24. The plug 28 in the through-hole 24 is formed by successively depositing a barrier metal film (TiN film/Ti film) 28a and a W film 28b on the silicon oxide film 25 including the inner surfaces of the through-hole 24 and removing the W film 28B from the upper portion of the silicon oxide film 25 by etching.

Figure 7:
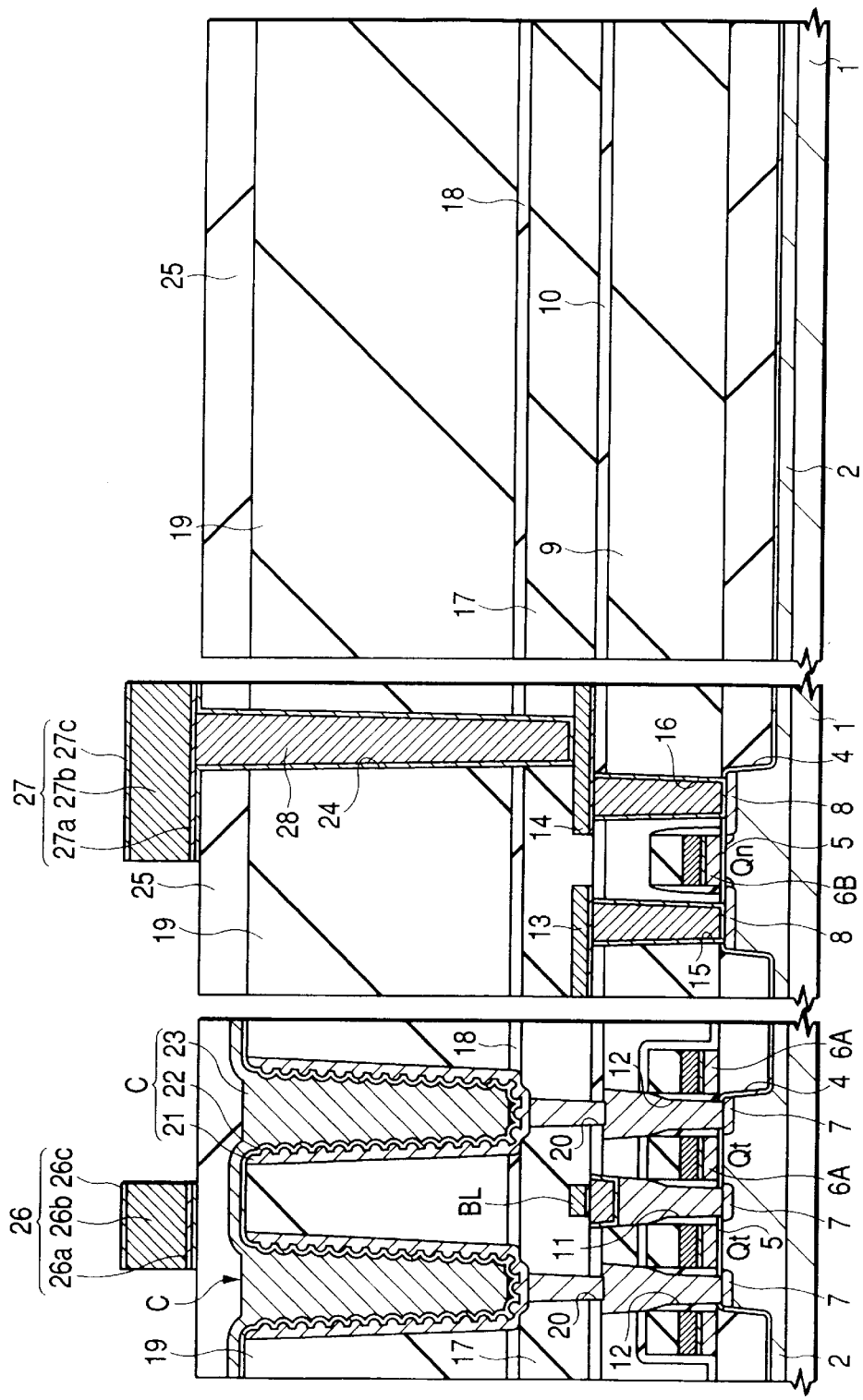
FIG. 7 is a sectional view of the essential part of the semiconductor substrate showing a further step in the process for manufacturing a semiconductor integrated circuit device according to the one embodiment of the invention.

As shown in FIG. 7, a second-layer wire 26 is formed on the silicon oxide film 25 at the memory portion, and a second-layer wire 27 is formed on the silicon oxide film 25 at the peripheral circuit portion. The wires 26, 27 are, respectively, formed by successively depositing Ti films (26a, 27a), AL alloy films (26b, 27b) and TiN films (26c, 27c) on the silicon oxide film 25, followed by etching these films and the barrier metal (TiN/Ti) film 28a left on the silicon oxide film 25 in the course of forming the plug 28.

Figure 8:
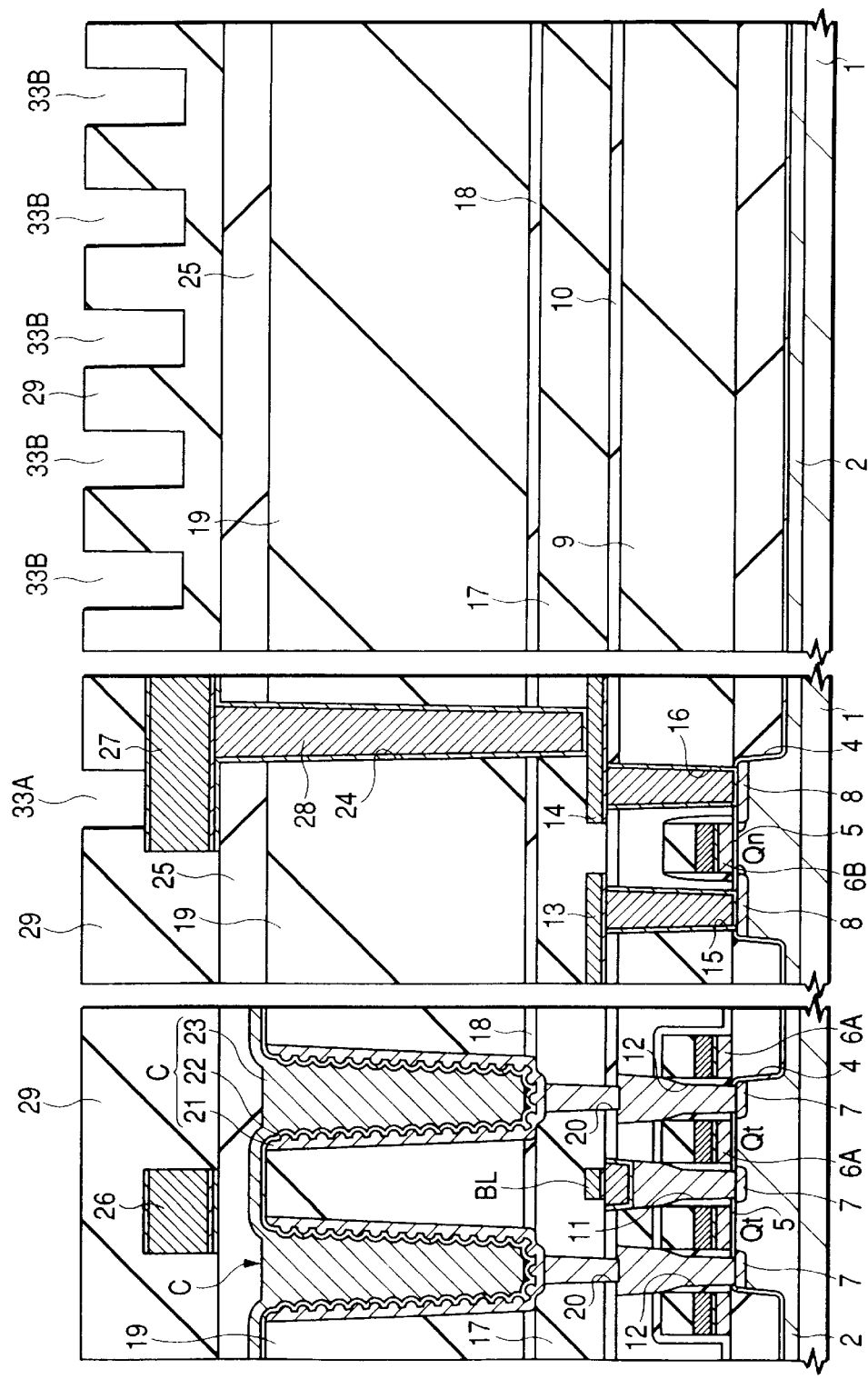
FIG. 8 is a sectional view of the essential part of the semiconductor substrate showing a still further step in the process for manufacturing a semiconductor integrated circuit device according to the one embodiment of the invention.

Next, as shown in FIG. 8, after formation of an interlayer insulating film 29 by building up a silicon oxide film, a spin-on-glass (spin coating) film and a silicon oxide film over the second-layer wires 26, 27, the interlayer insulating film 29 over the wire 27 at the peripheral circuit portion is etched to form a through-hole 33A reaching the surface of the wire 27, and the interlayer insulating film 29 at the bonding pad region is etched to from holes 33B. The diameter of the through-hole 33A is made substantially equal to that of the hole 33B, under which etching conditions can be made uniform. Overetching is performed in order to completely remove the interlayer insulating film 29 from the bottom (at the upper portion of the wire 27) of the through-hole 33A, so that the interlayer insulating film 29 at the bottom of the hole 33B, below which no wire is formed, is excessively etched, resulting in the depth of the hole 33B larger than that of the through-hole 33A.

Figure 9:
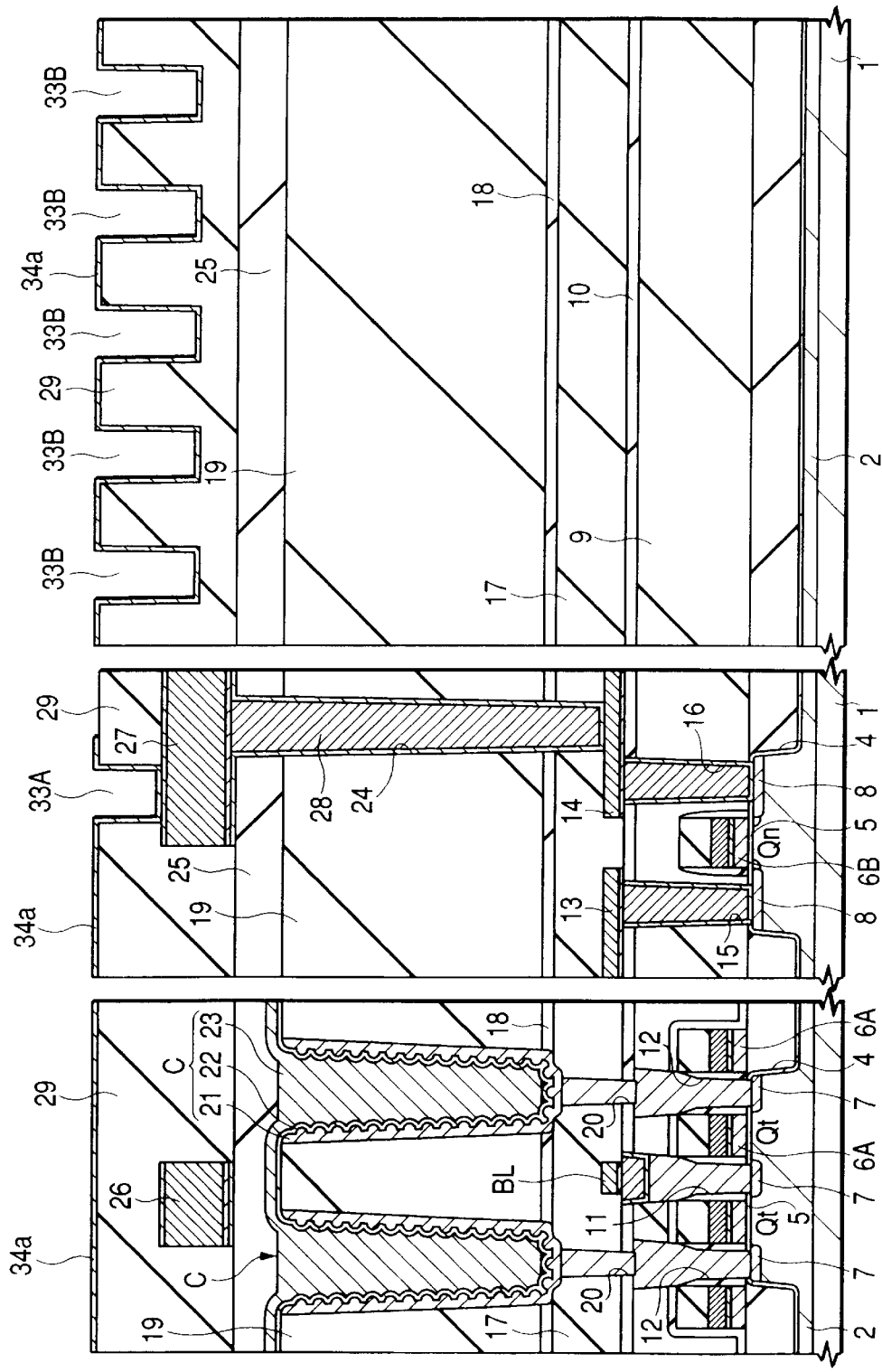
FIG. 9 is a sectional view of the essential part of the semiconductor substrate showing a yet further step in the process for manufacturing a semiconductor integrated circuit device according to the one embodiment of the invention.
Figure 10:
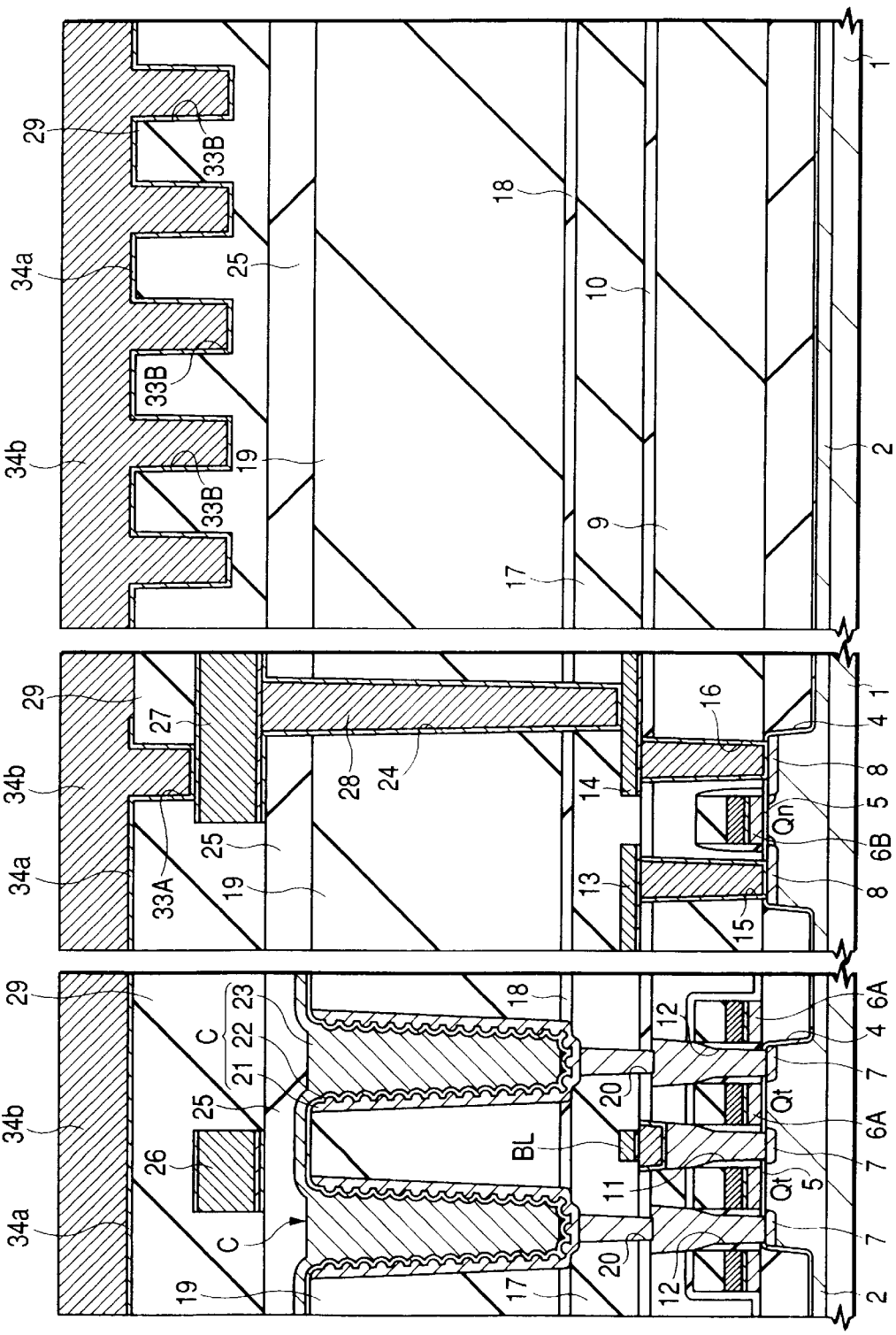
FIG. 10 is a sectional view of the essential part of the semiconductor substrate showing yet another step in the process for manufacturing a semiconductor integrated circuit device according to the one embodiment of the invention.
Figure 11:
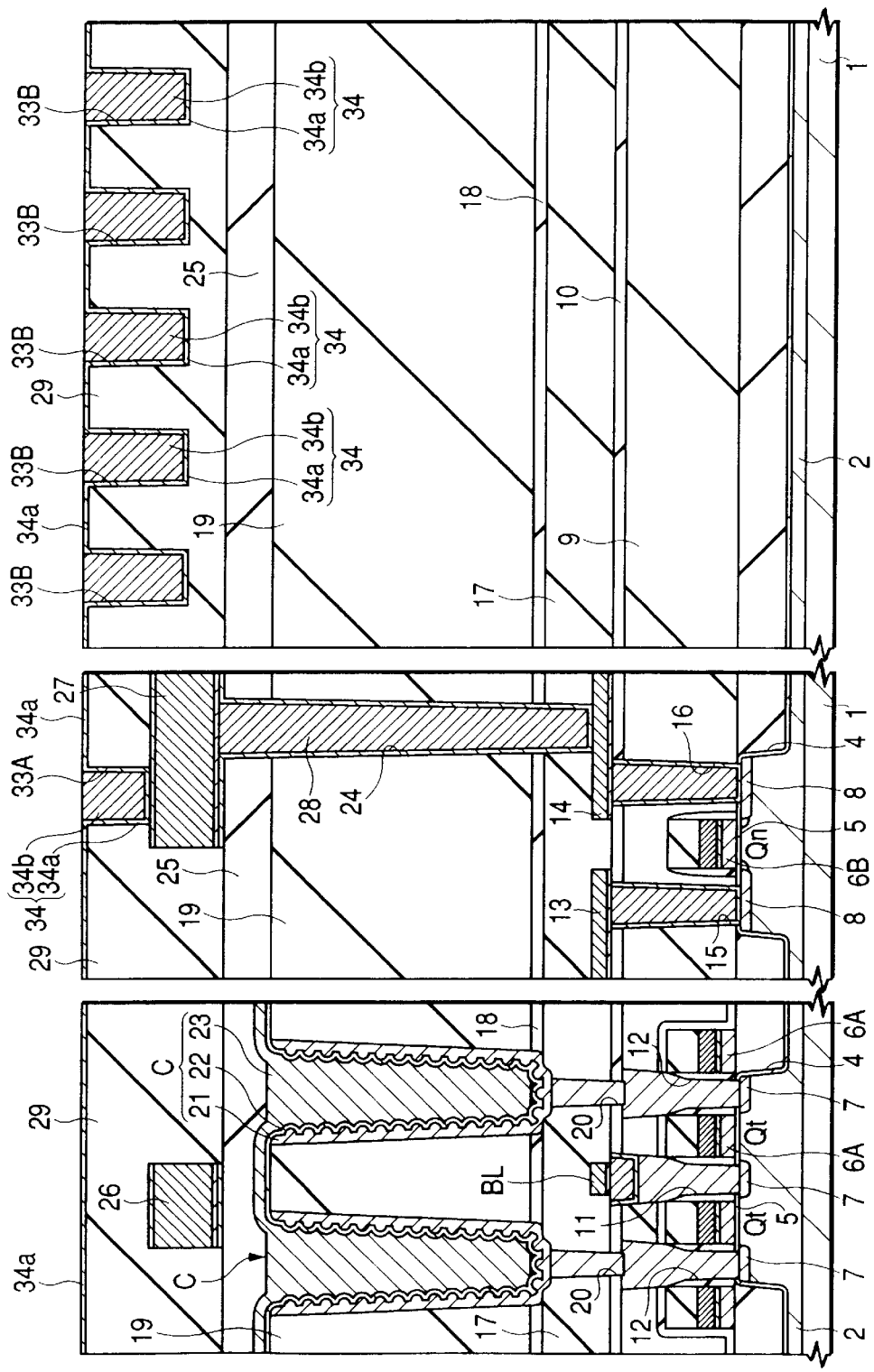
FIG. 11 is a sectional view of the essential part of the semiconductor substrate showing another step in the process for manufacturing a semiconductor integrated circuit device according to the one embodiment of the invention.

Next, as shown in FIG. 9, a barrier metal film 34a consisting of a Ti film and a TiN film is deposited on the silicon oxide film 29 including the inner surfaces of the through-hole 33A and the holes 33B. Subsequently, W film 34b is deposited on or over the barrier metal film 34a, followed by removing the W film 34b from the upper portion of the silicon oxide film 29 by etching, thereby forming a plug 34 in the through-hole 33A and the holes 33B, respectively.

The Ti film of the barrier metal 34a constituting part of the plug 34 serves as a bonding layer between the silicon oxide film constituting part of the interlayer insulating film 29 and the W film 34b. The overetching permits the TiN film 27c constituting part of the wire 27 to be removed, thereby causing the Al alloy film 27b to be exposed at the bottom of the through-hole 33A. Accordingly, the Al alloy film 27b is nitrided upon formation of the TiN film of the plug 34, thereby increasing the contact resistance between the plug 34 and the wire 27. The Ti film constituting part of the barrier metal 34a is formed below the TiN film in order to prevent the increase of the contact resistance.

In this way, the removal of the W film 34b over the interlayer insulating film 29 by etching allows the barrier metal film 34a made of the TiN film formed on the Ti film to be left on the interlayer insulating film 29. The surface of the barrier metal film 34a is exposed to a fluorine-containing gas ($SF_6$+Ar) used for the etching, so that Ti in the barrier metal film 34a is reacted with excess F (fluorine) and eventually gasified. This may cause the adhesion between the barrier metal film 34a and the lower interlayer insulating film 29 to be lowered. However, since F (fluorine) does not enter inside of the through-hole 33A and inside of holes 33B, there is no possibility that the adhesion between the barrier metal film 34a and the interlayer insulating film 29 in the through-hole 34A and also in the holes 33B is lowered.

Figure 12:
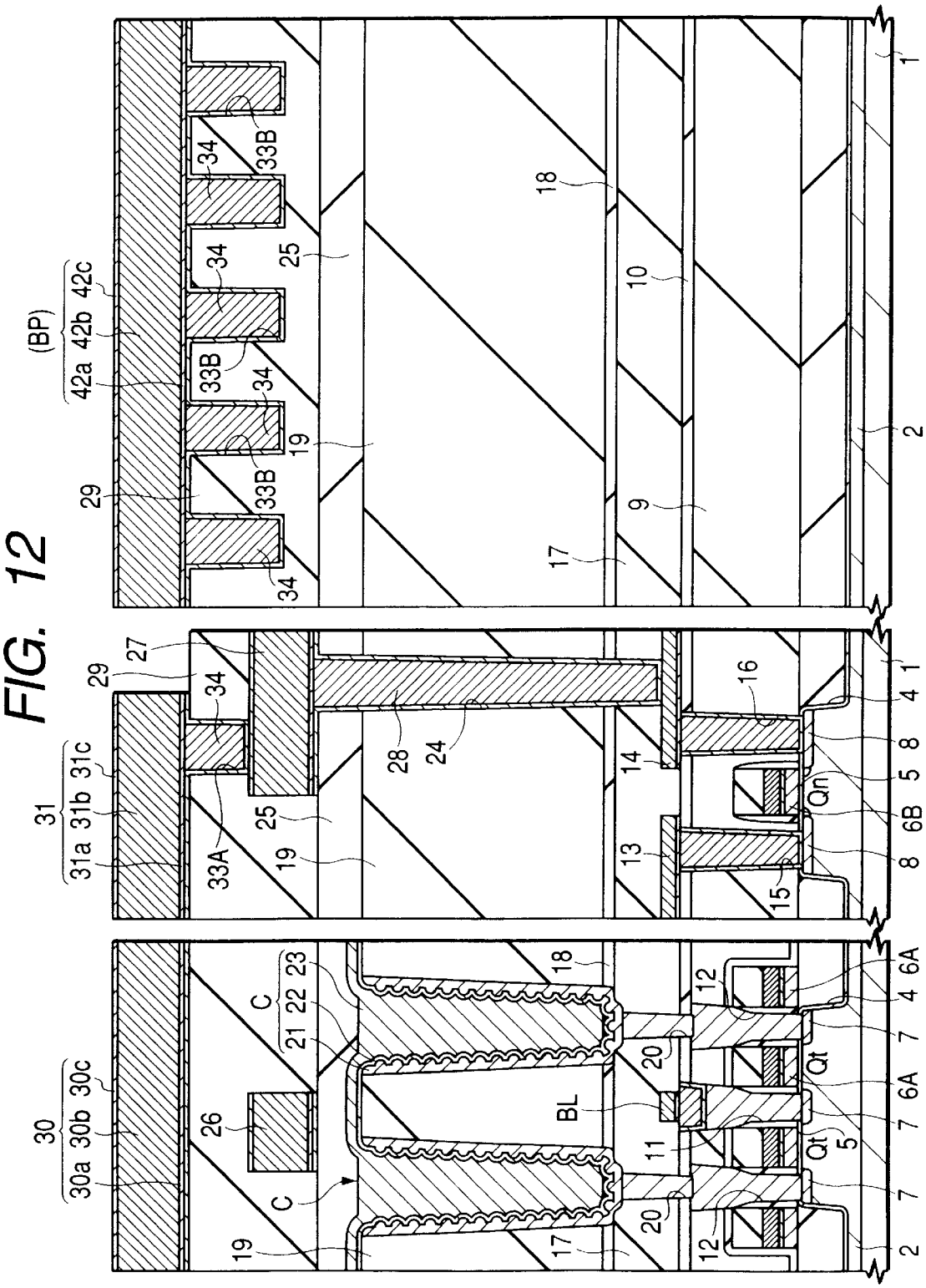
FIG. 12 is a sectional view of the essential part of the semiconductor substrate showing still another step in the process for manufacturing a semiconductor integrated circuit device according to the one embodiment of the invention.

Next, as shown in FIG. 12, Ti films (30a, 31a, 42a), Al alloy films (30b, 31b, 42b) and TiN films (30c, 31c, 42c) are, successively deposited over the silicon oxide film 29, respectively, after which the barrier metal 34a left on the silicon oxide film 29 during the step of forming the plug 34 is etched to form third-layer wires 30, 31 in the element-forming region and to form a metal pattern (BP) serving as a bonding pad in the bonding pad-forming region.

Thereafter, after formation of a passivation (surface protecting film) film 36 made of a multi-layered film of a silicon oxide film and a silicon nitride film on the surface of the substrate 1, the passivation film 36 is removed by etching from the bonding pad-forming region. At this stage, the TiN film 42c is also removed from the metal pattern (BP), thereby exposing the Al alloy film 42b. According to the steps set out hereinbefore, the bonding pad BP shown in FIG. 2 is completed.

Thus, according to this embodiment, a plurality of holes 33B is provided in the interlayer insulating film beneath the bonding pad BP, in which the plug 34 is buried thereby permitting the surface of each plug 34 and the lower surface of the bonding pad BP to be contact with each other. Thus, the adhesion at the interface between the bonding pad BP and the interlayer insulating film 29 can be made greater than in the case where a bonding pad BP is formed on the surface of a flat interlayer insulating film 29.

Figure 13:
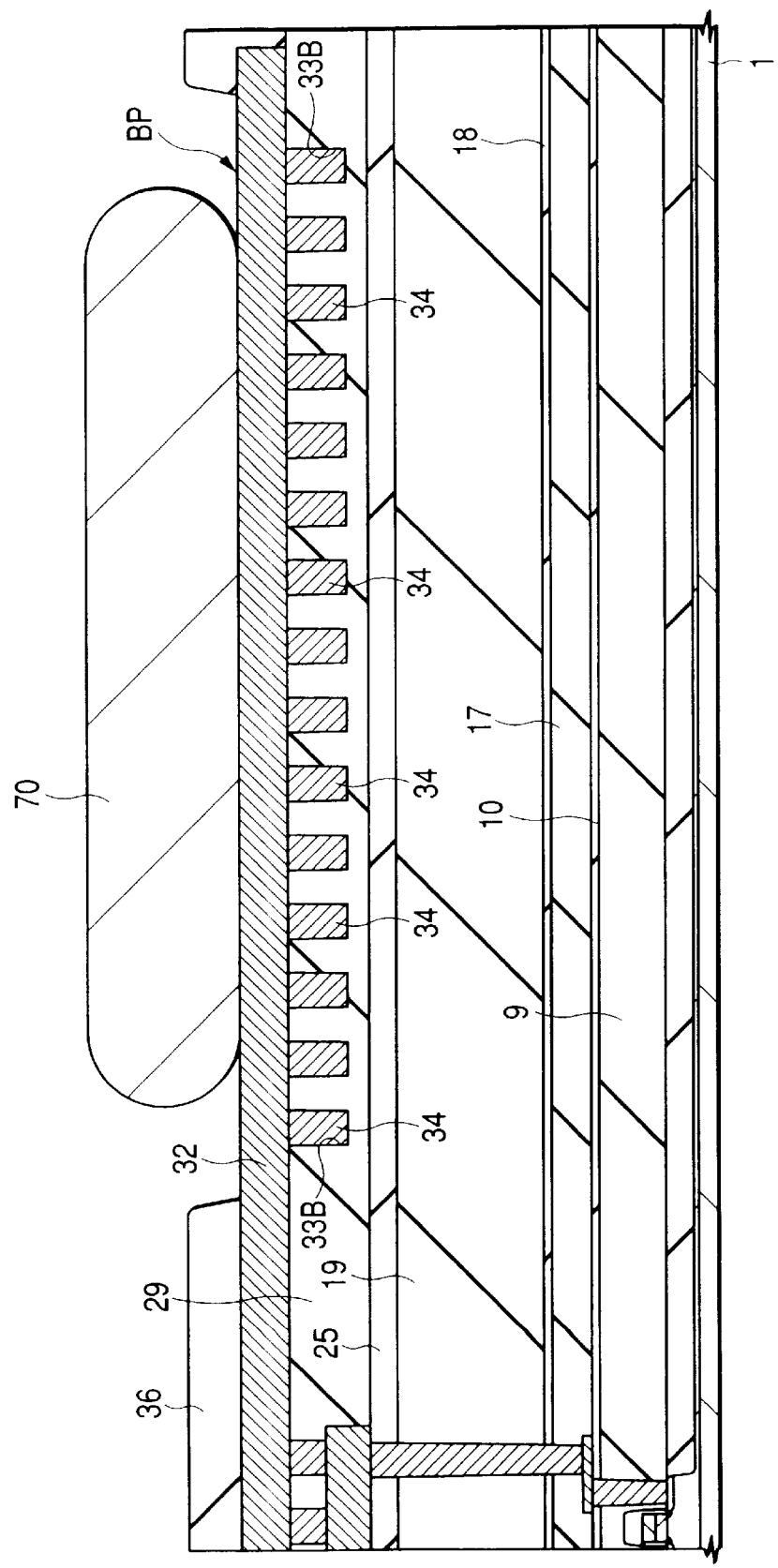
FIG. 13 is a sectional view of the essential part of the semiconductor substrate showing another step in the process for manufacturing a semiconductor integrated circuit device according to the one embodiment of the invention.
Figure 14:
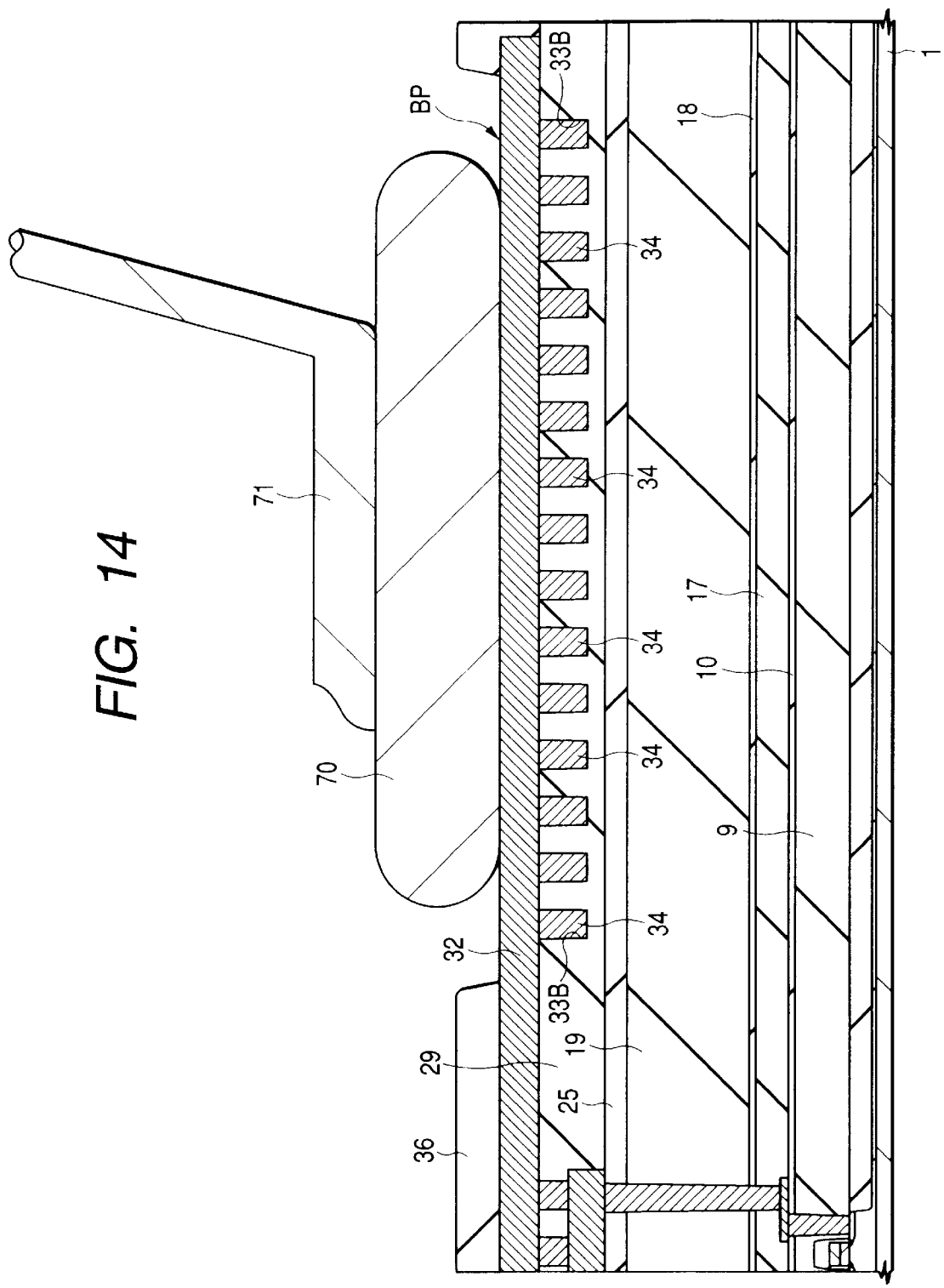
FIG. 14 is a sectional view of the essential part of the semiconductor substrate showing another step in the process for manufacturing a semiconductor integrated circuit device according to the one embodiment of the invention.

In this arrangement, where an Au wire 70 is bonded on the upper surface of the bonding pad BP by a ball bonding method using supersonic vibrations in combination as shown in FIG. 13, the adhesion at the interface between the bonding pad BP and the interlayer insulating film 29 is suppressed from lowering, thereby effectively preventing separation of the bonding pad BP at the interface. In the KGD process, Au wires 70, 71 are, respectively, bonded to the bonding pad BP, as shown in FIG. 14, upon inspection at the stage of individual chips and also upon inspection at a package stage. In this case, the separation of the bonding pad BP at the interface with the interlayer insulating film 29 can be effectively prevented.

In this embodiment, no wire is formed in a wiring layer (second wiring layer) beneath the bonding pad BP. Accordingly, the region beneath the bonding pad BP constituted mainly of Al does not take such a structure that the interlayer insulating film 29 that is harder than Al is sandwiched between upper and lower Al wires, with the result that there can be prevented the deficiency that the interlayer insulating film 29 provided beneath the bonding pad would otherwise suffer cracks owing to the impact of wire bonding.

Figure 15:
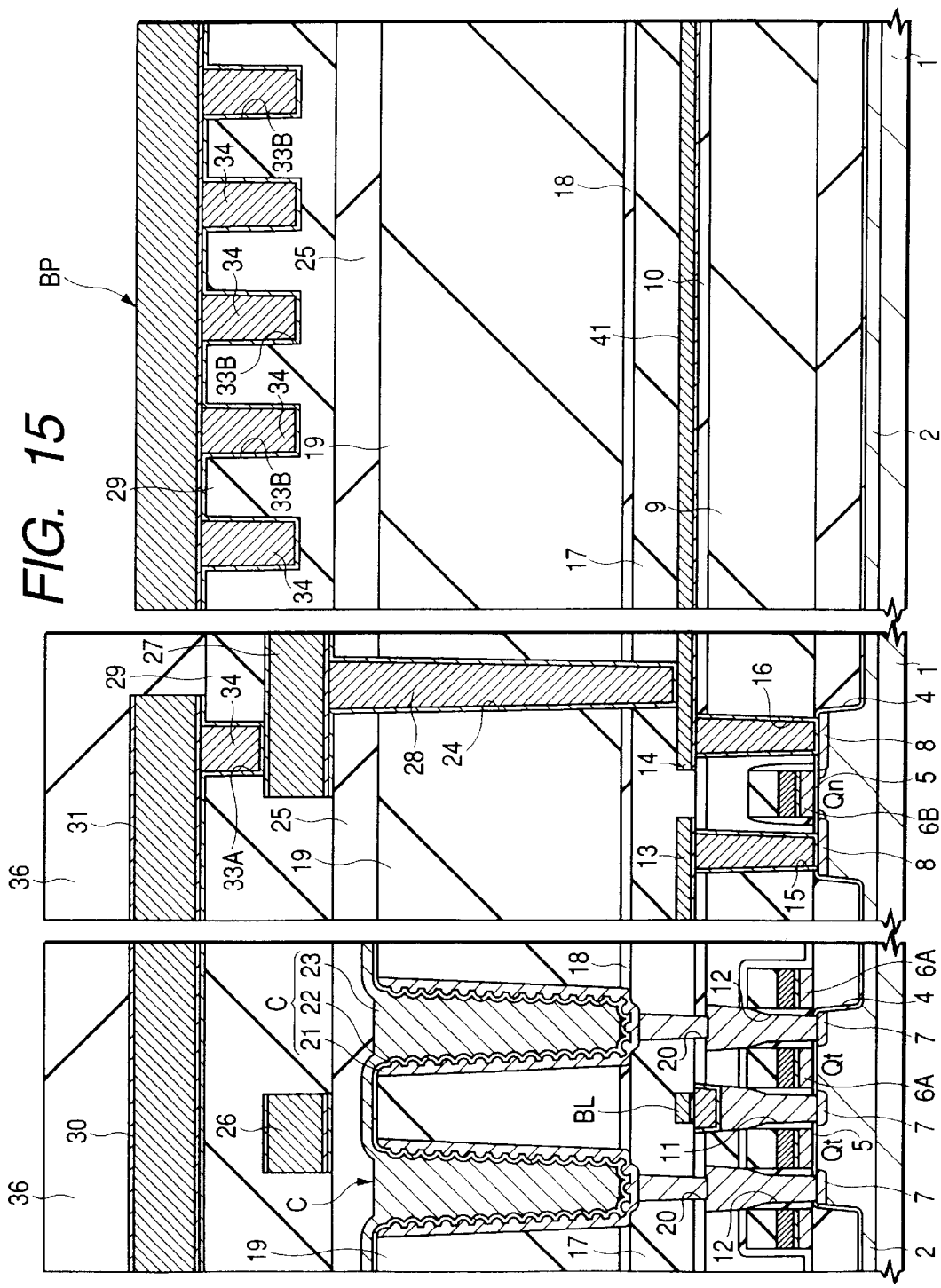
FIG. 15 is a sectional view of an essential part of a semiconductor substrate showing a semiconductor integrated circuit device according to another embodiment of the invention.

In this embodiment, there has been described the case where any wire is not form in any wiring layers in the lower region of the bonding pad BP. In this connection, however, it may be possible to form a wire 41, shown, for example, in FIG. 15, in a wiring layer (first wiring layer) lower than the wiring layer (second wiring layer) beneath the holes 33B buried with the plug 34.

Figure 16:
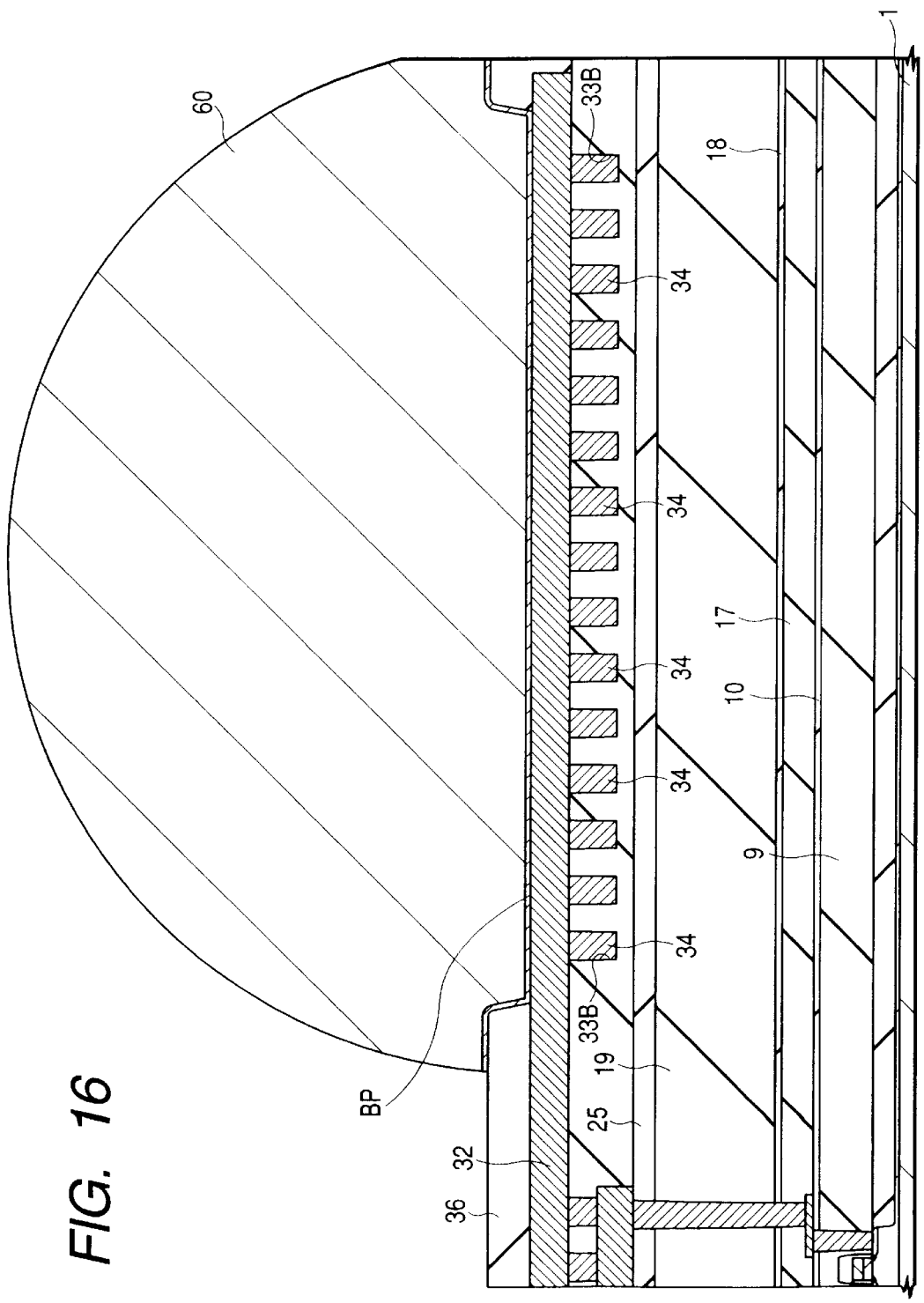
FIG. 16 is a sectional view of an essential part of a semiconductor substrate showing a semiconductor integrated circuit device according to another embodiment of the invention.

Moreover, limitation is not placed on the case where Au wires (50, 51) are bonded to the bonding pad BP, but the embodiment may be applicable to the case where a solder bump (or an Au bump) is connected to the bonding pad BP, as shown, for example, in FIG. 16.

The invention has been particularly described on the basis of the embodiments, which should not be construed as limiting the invention thereto, and many alterations and modifications may be possible without departing the spirit of the invention.

Figure 17:
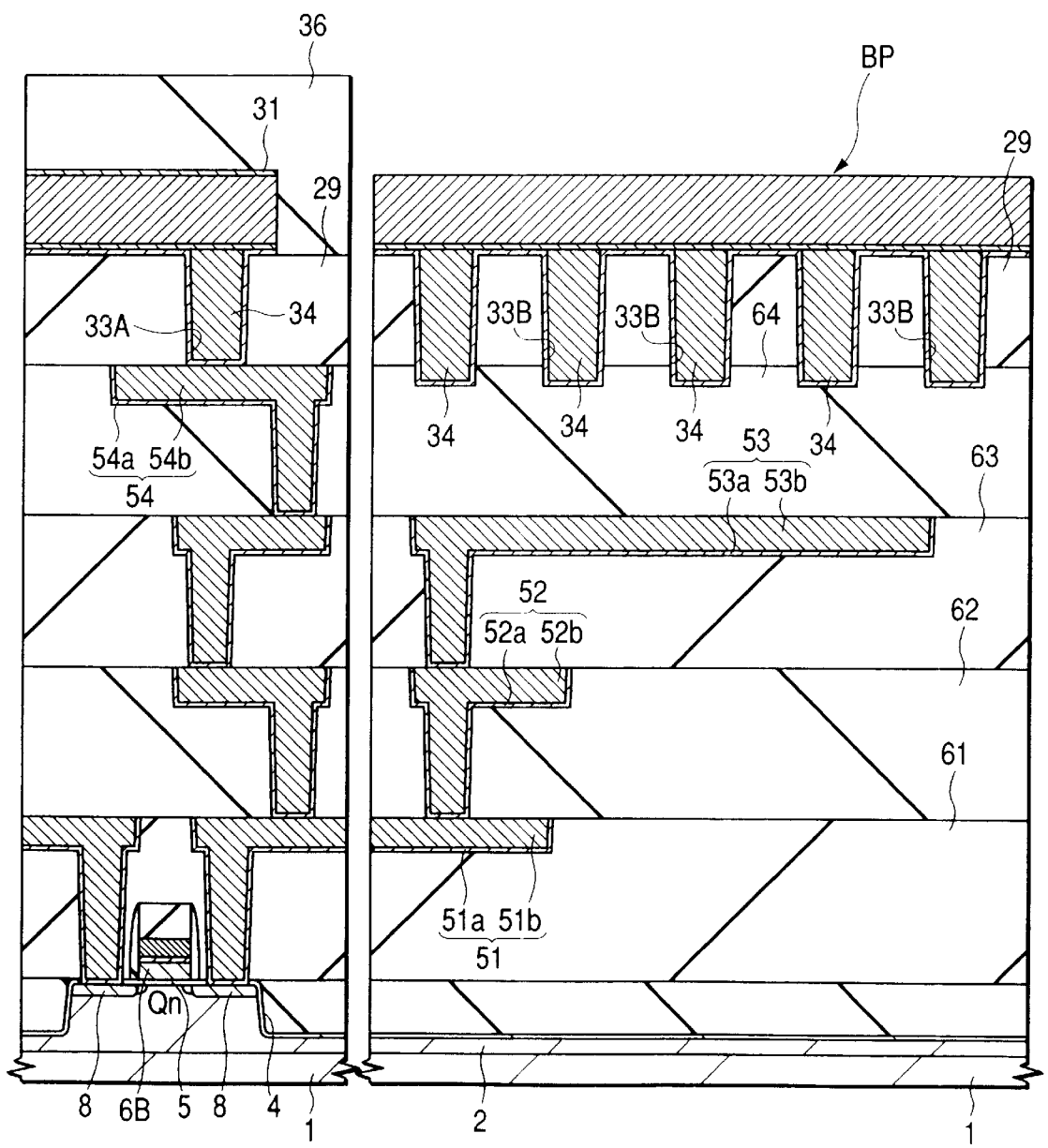
FIG. 17 is a sectional view of an essential part of a semiconductor substrate showing a semiconductor integrated circuit device according to another embodiment of the invention.

For instance, in the embodiments set out hereinabove, the application to DRAM having a three-layered wire is illustrated, but the invention may be applied to logic LSI and the like having a multi-layered wire having four or more layers, for example, shown in FIG. 17. It will be noted that where an upper wire 31 (including the bonding pad BP) is constituted of a conductive film made mainly of an Al alloy and the lower wires (51 to 54) are each made of Cu (copper) formed such as by the Damascene method, there is little possibility that when a Cu wire is formed as a wiring layer beneath the bonding pad, the interlayer insulating film is cracked because Cu is harder than Al.

Where the lower wires (51 to 54) are constituted of copper, respectively, these wires (51 to 54) should, respectively, be in the form of conductive films including upper Cu films (51b to 54b) formed on barrier metal films (51a to 54a) made of TaN and TiN. The material for the lower wires (51 to 54) is not limited to copper, but these wires may be constituted of a conductive film made of an Al alloy, like the upper wire 31.

Figure 18:
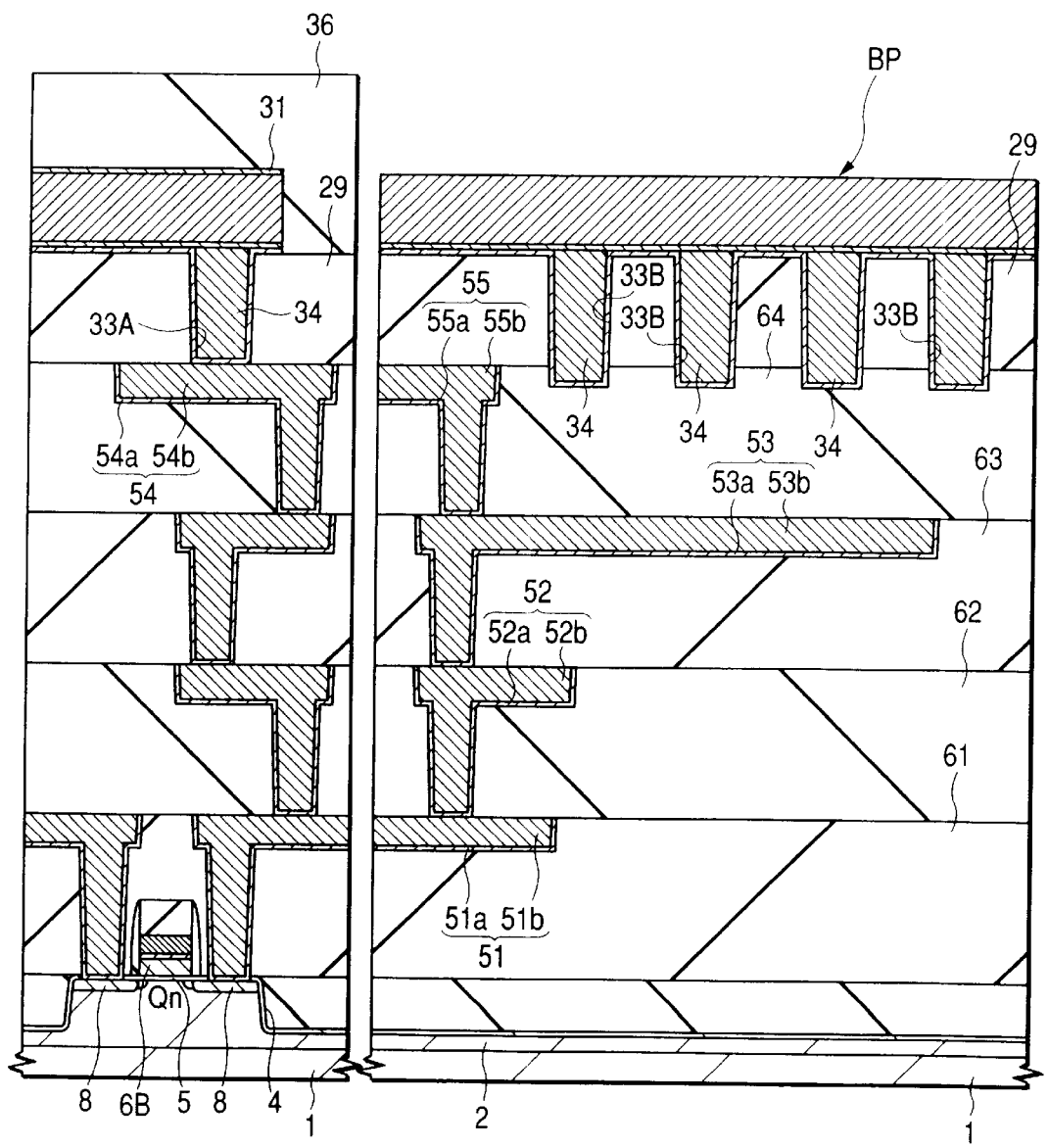
FIG. 18 is a sectional view of the essential part of the semiconductor substrate showing the semiconductor integrated circuit device according to another embodiment of the invention.

Moreover, as shown in FIG. 18, a lower wire 55, which is not connected with the plug 34, may be formed in the bonding pad-forming region. This formation leads to an improvement in bonding between the bonding pad BP and the interlayer insulating film 29 and also to realization of a higher degree of integration by improving the degree of freedom in design of wires.

Figure 19:
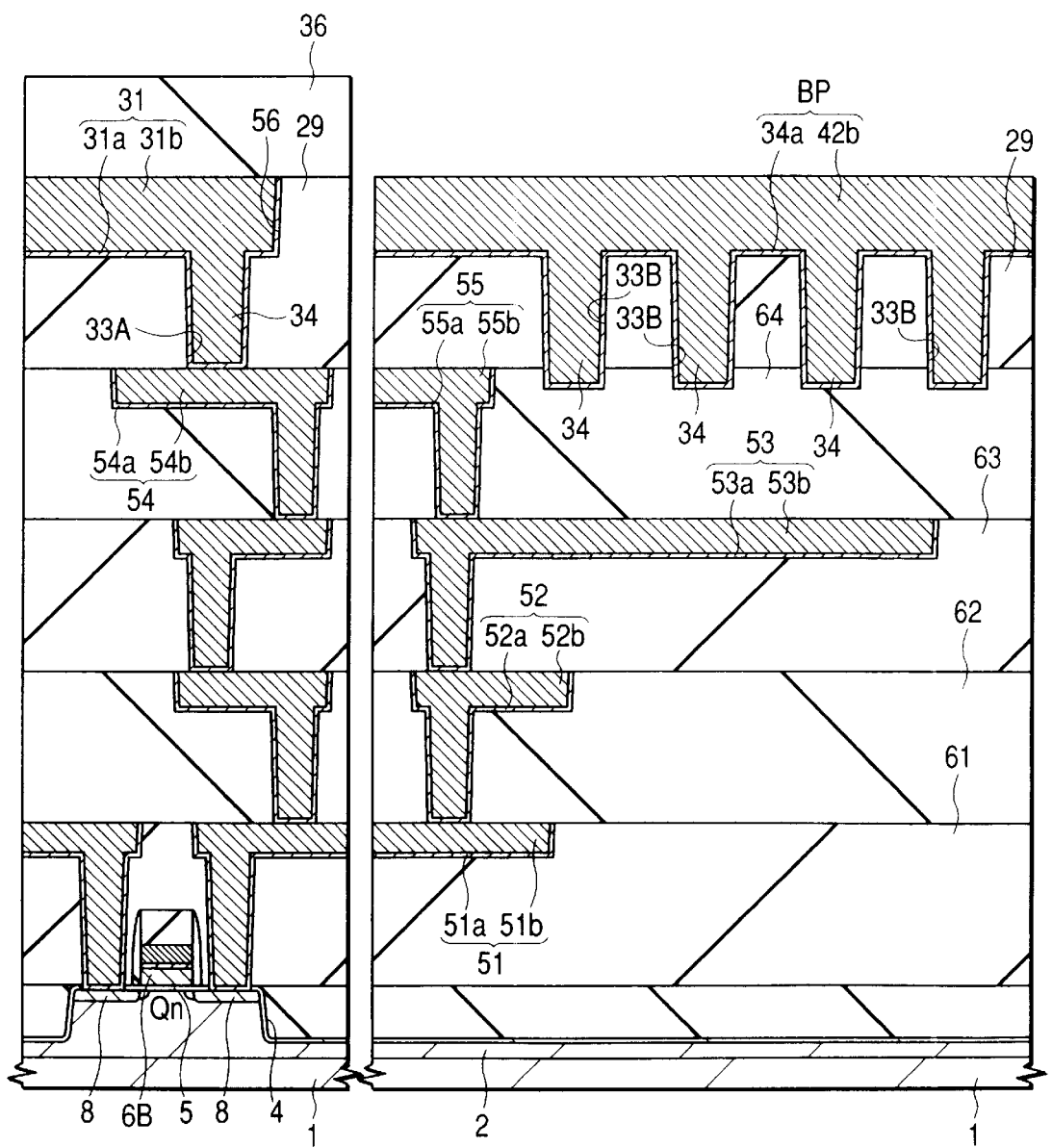
FIG. 19 is a sectional view of the essential part of the semiconductor substrate showing the semiconductor integrated circuit device according to another embodiment of the invention.

Further, as shown in FIG. 19, the upper wire 31 (including the bonding pad BP) may be constituted of a conductive film primarily made of an Al alloy film (31b, 42b) formed by the dual Damascene method. The upper wire 31 (bonding pad BP) is formed by successively depositing a barrier metal film 34a and an Al alloy film 31b (42b) in a through-hole 33A (hole 33b) formed in the interlayer insulating film 29 and also in an upper wire groove 56, followed by polishing the Al alloy film 31b (42b) by a chemical mechanical polishing method or etching back. In this case, the wire 31 (bonding pad BP) and the plug 34 are integrally combined.

The effects obtained by typical embodiments of the invention are summarized below.

According to the invention, since the plug is formed in the interlayer insulating film beneath the bonding pad, the adhesion between the bonding pad and the interlayer insulating film can be improved, thereby effectively preventing the separation of the bonding pad.

Further, any wire is not formed in a wiring layer beneath the bonding pad, so that there can be effectively prevented the disadvantage that the interlayer insulating film beneath the bonding pad would otherwise be cracked owing to the impact at the time of wire bonding.

What is claimed is:

1. A method for manufacturing a semiconductor integrated circuit device comprising the steps of:

(a) forming a wire in an element-forming region on a semiconductor substrate and further forming an interlayer insulating film over said wire and in a bond pad-forming region;

(b) etching said interlayer insulating film in the element-forming region to form a through-hole reaching said wire, and etching said interlayer insulating film in the bonding pad-forming region to form a hole;

(c) forming a barrier metal film on said interlayer insulating film including the inner surfaces of said hole and the inner surfaces of said through-hole and forming a first conductive film containing as its main component a refractory metal film on the upper portion of said barrier metal film so that said first conductive film is buried in said hole and in said through-hole;

(d) removing said first conductive film from the upper portion of said interlayer insulating film by etching to form a first plug constituted of said barrier metal film and said first conductive film in said hole and also a second plug constituted of said barrier metal film and said first conductive film in said through-hole;

(e) forming a second conductive film over the upper portion of said interlayer insulating film; and (f) etching said second conductive film so that an uppermost wire is formed on said interlayer insulating film in the element-forming region and forming a bonding pad on said first interlayer insulating film in the bonding pad-forming region.

2. A method for manufacturing a semiconductor integrated circuit device according to claim 1, further comprising, after the step (f), the steps of bonding a first wire on said bonding pad and bonding a second wire on said first wire.

3. A method for manufacturing a semiconductor integrated circuit device according to claim 1, wherein said barrier metal film is made of a mulit-layered film of a TiN film formed on a Ti film, said first conductive film includes a W film, and the etching of said first conductive film is carried out in an atmosphere of a gas containing fluorine.

4. A method for manufacturing a semiconductor integrated circuit device according to claim 3, wherein said refractory metal film is made of tungsten (W).

5. A method for manufacturing a semiconductor integrated circuit device according to claim 3, wherein said barrier metal film is a composite film layer including a metal film and a metal nitride film thereon made of a same metal material as said metal film.

6. A method for manufacturing a semiconductor integrated circuit device according to claim 1, wherein in step (b), the etching of the interlayer insulating film is such that said through-hole, in the element-forming region, and said hole, in the bonding pad-forming region, have substantially equal diameters and that over-etching is performed so that the achieved depth of said hole in said interlayer insulating film is greater than that of said through-hole.

7. A method for manufacturing a semiconductor integrated circuit device according to claim 1, wherein, in step (a), the wire formed is a multi-layered film on a barrier metal film.

8. A method for manufacturing a semiconductor integrated circuit device according to claim 1, wherein said first plug is formed to be in metal contact only with said bonding pad.

9. A method for manufacturing a semiconductor integrated circuit device according to claim 2, wherein said refractory metal film is made of tungsten (W).

10. A method for manufacturing a semiconductor integrated circuit device according to claim 2, wherein said barrier metal film is a composite film layer including a metal film and a metal nitride film thereon made of a same metal material as said metal film.

11. A method for manufacturing a semiconductor integrated circuit device according to claim 3, further comprising, after the step (f), the steps of bonding a first wire on said bonding pad and bonding a second wire on said first wire.

12. A method for manufacturing a semiconductor integrated circuit device according to claim 7, wherein, in step (a), the multi-layered film contains a Ti film, an Al alloy film on said Ti film and a titanium nitride (TiN) film on said Al alloy film.

* * * * *